United States Patent
Usuda et al.

(10) Patent No.: US 9,917,416 B2
(45) Date of Patent: Mar. 13, 2018

(54) SEMICONDUCTOR LASER OSCILLATOR

(71) Applicants: AMADA HOLDINGS CO., LTD., Kanagawa (JP); LUMENTUM OPERATIONS LLC, Milpitas, CA (US)

(72) Inventors: Kaori Usuda, Kanagawa (JP); Minoru Ogata, Kanagawa (JP)

(73) Assignees: AMADA HOLDINGS CO., LTD., Kanagawa (JP); LUMENTUM OPERATIONS LLC, Milpitas, CA (US)

( * ) Notice: Subject to any disclaimer, the term of this patent is extended or adjusted under 35 U.S.C. 154(b) by 0 days.

(21) Appl. No.: 15/504,820

(22) PCT Filed: Oct. 13, 2015

(86) PCT No.: PCT/JP2015/078877
§ 371 (c)(1),
(2) Date: Feb. 17, 2017

(87) PCT Pub. No.: WO2016/060103
PCT Pub. Date: Apr. 21, 2016

(65) Prior Publication Data
US 2017/0279245 A1    Sep. 28, 2017

(30) Foreign Application Priority Data

Oct. 15, 2014 (JP) ................................. 2014-210491

(51) Int. Cl.
*H01S 5/042* (2006.01)
*H01S 5/40* (2006.01)
(Continued)

(52) U.S. Cl.
CPC .......... *H01S 5/0427* (2013.01); *B23K 26/702* (2015.10); *H01S 5/0071* (2013.01); *H01S 5/4012* (2013.01); *H01S 5/4025* (2013.01)

(58) Field of Classification Search
CPC .... H01S 5/0427; H01S 5/4012; H01S 5/4025; H01S 5/0071; B23K 26/702
See application file for complete search history.

(56) References Cited

U.S. PATENT DOCUMENTS

| | | | | |
|---|---|---|---|---|
| 4,439,861 A | * | 3/1984 | Bradford | ............... H01S 3/0941 372/25 |
| 5,729,568 A | * | 3/1998 | Opower | ............... B23K 26/032 372/108 |

(Continued)

FOREIGN PATENT DOCUMENTS

| | | |
|---|---|---|
| JP | 2683158 | 5/1995 |
| JP | 2001-284732 | 10/2001 |

(Continued)

OTHER PUBLICATIONS

Search Report issued in WIPO Patent Application No. PCT/JP2015/078877, dated Dec. 28, 2015.

*Primary Examiner* — Xinning Niu
(74) *Attorney, Agent, or Firm* — Greenblum & Bernstein, P.L.C.

(57) ABSTRACT

A semiconductor laser oscillator includes a diode unit configured from a plurality of banks, in which one bank is configured from a plurality of laser diodes connected in series. The diode unit includes a wavelength locking mechanism for locking to a plurality of wavelengths. The semiconductor laser oscillator includes a controller configured to control input currents to the laser diodes of each of the plurality of banks individually in correspondence to a char- (Continued)

acteristic of a wavelength locking efficiency, and to control an output of the diode unit as a whole to a required output.

5 Claims, 6 Drawing Sheets

(51) Int. Cl.
*H01S 5/00* (2006.01)
*B23K 26/70* (2014.01)

(56) References Cited

U.S. PATENT DOCUMENTS

| | | | |
|---|---|---|---|
| 8,428,092 | B2 | 4/2013 | Hayano et al. |
| 2001/0026573 | A1 | 10/2001 | Takayama et al. |
| 2001/0030983 | A1 | 10/2001 | Yuri et al. |
| 2001/0033590 | A1 | 10/2001 | Yuri et al. |
| 2008/0019010 | A1 | 1/2008 | Govorkov et al. |
| 2009/0190218 | A1 | 7/2009 | Govorkov et al. |
| 2010/0103088 | A1* | 4/2010 | Yokoyama ............ G02F 1/3775 345/102 |
| 2012/0213238 | A1 | 8/2012 | Hayano et al. |

FOREIGN PATENT DOCUMENTS

| | | |
|---|---|---|
| JP | 2002-335042 | 11/2002 |
| JP | 2010-263063 | 11/2010 |
| JP | 2012-174720 | 9/2012 |
| JP | 2013-197371 | 9/2013 |
| JP | 2013-233556 | 11/2013 |
| JP | 2014-104479 | 6/2014 |
| WO | 2014/133013 | 9/2014 |

\* cited by examiner

SEMICONDUCTOR LASER OSCILLATOR

TECHNICAL FIELD

The present disclosure relates to a semiconductor laser oscillator for emitting a laser.

BACKGROUND ART

Conventionally, the semiconductor laser oscillator is frequently utilized for the purpose of excitation of a solid state laser and fiber laser, and a processing machine with a direct diode laser (DDL) to be used directly in processing is widespread due to the achievement of high luminance. As the DDL oscillator, there is an oscillator using a plurality of single emitter laser diodes with a high output. This DDL oscillator emits a laser in which spectral beams are coupled by locking to respective ones of a plurality of wavelengths.

In the DDL oscillator configured from single emitter laser diodes, it is common to divide a plurality of laser diodes into a plurality of banks, and control them such that an identical current value will flow in each bank. In one bank, 30-40 pieces of laser diodes are connected in series, for example.

CITATION LIST

Patent Literature

[PTL 1] Japanese Unexamined Patent Application Publication No. 2012-174720

SUMMARY OF THE INVENTION

In the DDL oscillator, a high output and a high luminance are achieved by coupling spectral beams. In order to realize the spectral beam coupling for the laser of a plurality of wavelengths, the spectrum of each wavelength needs to have a narrow bandwidth. To this end, the DDL oscillator locks the laser to a plurality of desired wavelengths by means of an external oscillator.

At this point, with a higher wavelength locking efficiency, the spectral beams can be coupled more efficiently so that a highly efficient laser output can be obtained. In order to increase the wavelength locking efficiency, there is a need to select optimal materials for the laser diodes that oscillate close to each locking wavelength. However, it is practically impossible to manufacture the laser diodes with different materials for each one of all the locking wavelengths.

For this reason, it is common to distribute the laser diodes manufactured with a plurality of types of materials with respect to each locking wavelength, so that the wavelength locking efficiency becomes high at least at a time of high output.

The laser diode has a characteristic that a wavelength of the emitted laser is shifted to a long wavelength side by about 0.25 to 0.3 nm, with a temperature increase of 1° C. Thus, when the output of the laser diode is increased, the amount of heat generation increases and the temperature rises, so that the wavelength of the emitted laser is shifted to the long wavelength side. Consequently, for a material in which a wavelength is adjusted in accordance with a time of high output, there are cases in which it is difficult to maintain the high wavelength locking frequency because the wavelength is shifted to a low wavelength at a time of low output, even when it has the high wavelength locking efficiency with a high output.

A relationship of a laser output with respect to an input current will be a straight line for the usual laser diode that is not locked to wavelengths. However, when it is made to have a higher output by flowing higher currents into the laser diode, a temperature difference from a time of low output becomes larger, and a wavelength shift amount becomes larger, so that there is a tendency to have a lower efficiency at a time of low output when it is locked to wavelengths. For these reasons, a relationship of the laser output with respect to the input current to the laser diode of each bank in the DDL oscillator will not be a straight line, and it will have a characteristic of a downward convex curve at the time of low output.

The laser with a low efficiency for wavelength locking, oscillated at a wavelength other than the locking wavelength, will increase a loss in the laser to be emitted as its optical axis deviates from the original optical axis. Then, however, the loss will cause heat generation inside of the semiconductor laser oscillator and local heat generation of a transmission fiber injection portion. Thus, the performance of the semiconductor laser oscillator cannot be fully exhibited at its maximum.

The object of the embodiment is providing a semiconductor laser oscillator capable of maintaining a highly efficient wavelength locking even at a time of low output in the semiconductor laser oscillator, in which spectral beams are coupled by locking to wavelengths.

An aspect of the embodiments provides a semiconductor laser oscillator including: a diode unit configured from a plurality of banks connected in parallel, in which one bank is configured from a plurality of laser diodes connected in series, wherein the diode unit comprises a wavelength locking mechanism configured to lock to a plurality of wavelengths, and the semiconductor laser oscillator further comprises a controller configured to control input currents to the laser diodes of each of the plurality of banks individually in correspondence to a characteristic of a wavelength locking efficiency, and to control an output of the diode unit as a whole to a required output.

In accordance with the semiconductor laser oscillator according to the embodiment, it is possible to maintain the highly efficient wavelength locking even at a time of low output in the semiconductor laser oscillator, in which spectral beams are coupled by locking to wavelengths.

MODES FOR CARRYING OUT THE INVENTION

In the following, an embodiment of the semiconductor laser oscillator will be described with references to the accompanying drawings. First, the overall configuration and operation of a laser processing machine equipped with the embodiment of the semiconductor laser oscillator will be described.

Figure 1:
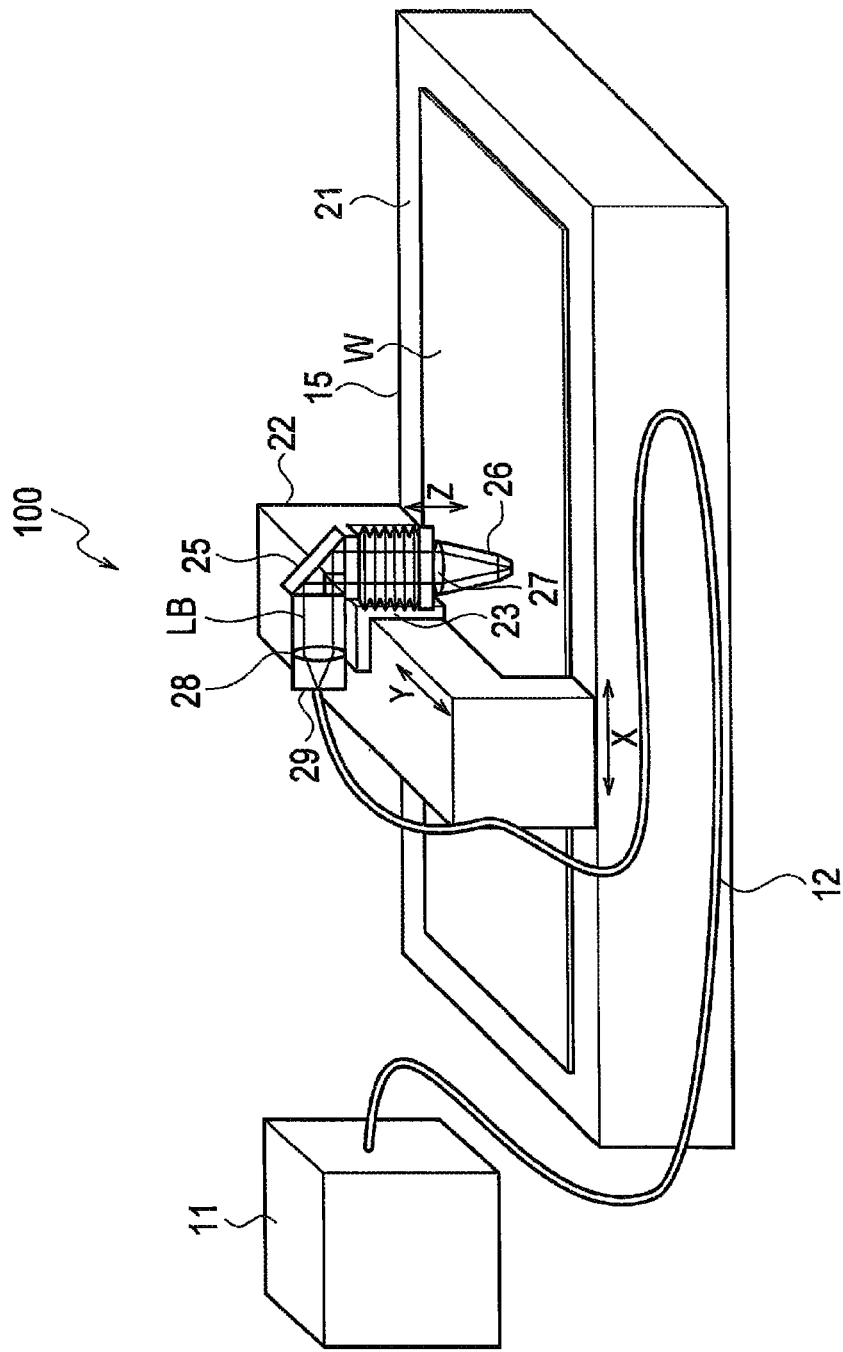
FIG. 1 is a perspective view showing an overall configuration of a laser processing machine having a semiconductor laser oscillator according to an embodiment.

The laser processing machine 100 shown in FIG. 1 is an exemplary case of a laser cutting processing machine for processing of cutting a material to be processed with the laser. The laser processing machine may be a laser welding processing machine for the processing of welding a material to be processed with the laser, a surface modification apparatus for modifying the surface of a material to be processed with the laser, or a marking apparatus for marking on a material to be processed with the laser.

The laser processing machine 100 is equipped with a laser oscillator 11 for generating and emitting the laser LB, a laser processing unit 15, and a process fiber 12 for transmitting the laser LB to the laser processing unit 15.

The laser oscillator 11 is a DDL oscillator, as one example. In the following, it will be referred to as a DDL oscillator 11. The concrete configuration and operation of the DDL oscillator 11 will be described in detail later. It suffices for the laser oscillator 11 to have a wavelength locking mechanism, and it is not to be limited to the DDL oscillator.

The process fiber 12 is installed along the X-axis and Y-axis cable ducts (not shown in the figure) that are arranged in the laser processing unit 15.

The laser processing unit 15 has a processing table 21 for mounting the material to be processed W, a gate type X-axis carriage 22 freely movable in an X-axis direction on the processing table 21, and a Y-axis carriage 23 freely movable in a Y-axis direction perpendicular to the X-axis on the X-axis carriage 22. In addition, the laser processing unit 15 has a collimator unit 29 fixed to the Y-axis carriage 23.

The collimator unit 29 has a collimator lens 28 for converting the laser LB emitted from an output terminal of the process fiber 12 into approximately parallel light beams, and a bend mirror 25 for reflecting the laser LB converted into the approximately parallel light beams toward a lower side of a Z-axis direction, perpendicular to the X-axis and the Y-axis. The collimator lens 29 also has a condensing lens 27 for condensing the laser LB reflected by the bend mirror 25, and a processing head 26.

The collimator lens 28, the bend mirror 25, the condensing lens 27, and the processing head 26 are fixed inside the collimator unit 29 in a state of having an optical axis adjusted in advance. In order to correct the focal position, the collimator lens 28 may be configured to move in the X-axis direction.

The collimator unit 29 is fixed to the Y-axis carriage 23 that is freely movable in the Y-axis direction, and the Y-axis carriage 23 is provided on the X-axis carriage 22 that is freely movable in the X-axis direction. Thus, the laser processing unit 15 is capable of moving the position to irradiate the laser LB emitted from the processing head 26 onto the material to be processed W in the X-axis direction and the Y-axis direction.

With the above configuration, the laser processing machine 100 is capable of carrying out the processing of cutting the material to be processed W by transmitting the laser LB emitted from the DDL oscillator 11 to the laser processing unit 15 through the process fiber 12, and irradiating it onto the material to be processed W in a state of high energy density.

Note that, when the processing of cutting the material to be processed W is to be carried out, an assist gas for removing molten material is injected onto the material to be processed W. In FIG. 1, a configuration for injecting the assist gas is omitted from being shown in the figure.

Figure 2:
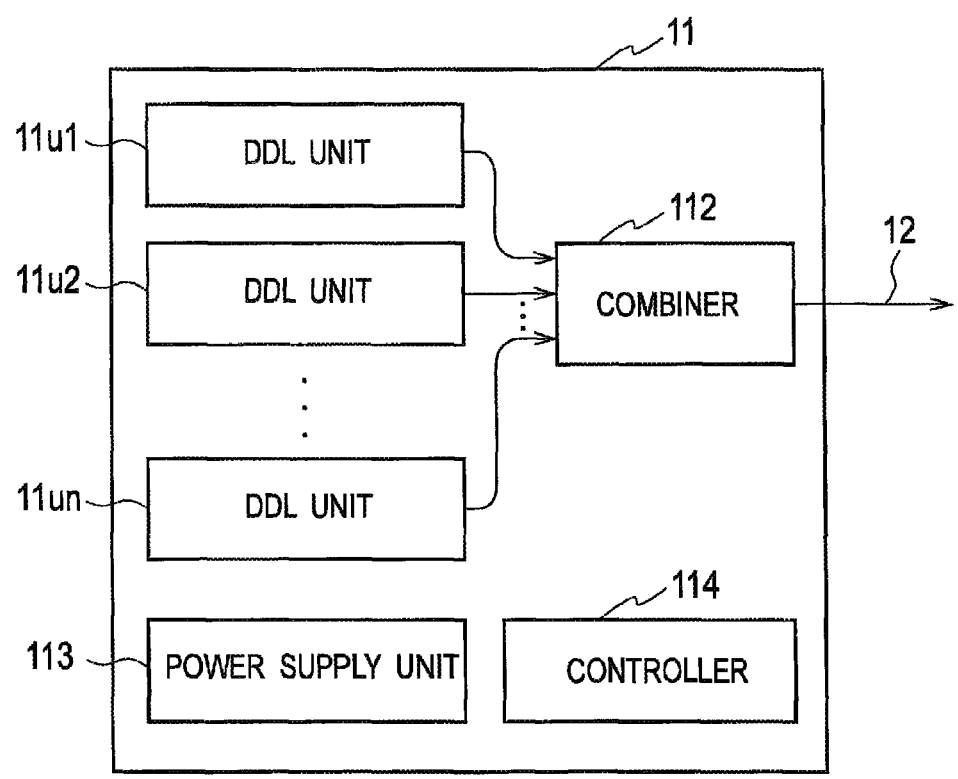
FIG. 2 is a block diagram snowing a semiconductor laser oscillator according to the embodiment.

Next, using FIG. 2 to FIG. 4, the concrete configuration and operation of the DDL oscillator 11 will be described. As shown in FIG. 2, the DDL oscillator 11 has n sets of DDL units from a DDL unit 11$u$1 to a DDL unit 11$un$, and a combiner 112 for spatially coupling beams of the laser emitted from each one of the DDL units 11$u$1-11$un$. The DDL units 11$u$1-11$un$ are one example of a diode unit.

Also, the DDL oscillator 11 has a power supply unit 113 for supplying power to the DDL units 11$u$1-11$un$, and a controller for controlling the DDL oscillator 11. The power supply unit 113 can be configured from a power supply circuit. The controller 114 can be configured from a microprocessor or a microcomputer.

Here, any unspecified DDL unit among the DDL units 11$u$1-11$un$ will, be referred to as a DDL unit 11$u$. The number n of DDL units 11$u$ is greater than or equal to 1. It suffices to set it appropriately according to a required output of the laser LB to be emitted. Note that, in the case of a single DDL unit 11$u$, there is no need for the combiner.

Figure 3:
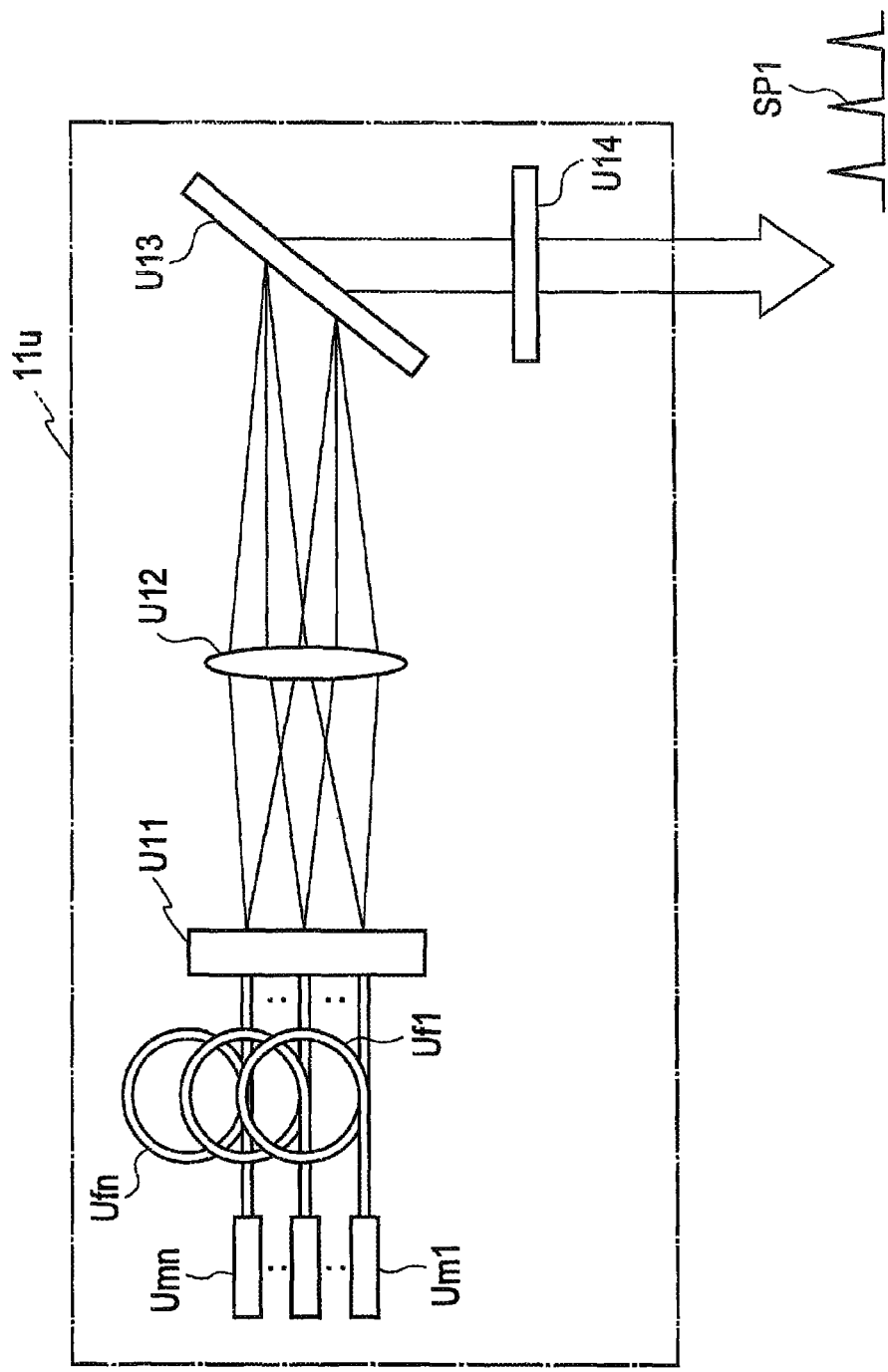
FIG. 3 is a conceptual diagram showing a concrete configuration of a DDL unit in FIG. 2.

To be concrete, the DDL unit 11$u$ is configured as shown in FIG. 3. The DDL unit 11$u$ has n set of laser diode modules, from a laser diode module Um1 to Umn.

Here, any unspecified laser diode module among the laser diode modules Um1-Umn will be referred to as a laser diode module Um. It also suffices to set the number n of laser diode modules Um appropriately.

Each one of the laser diode modules Um is configured from, a plurality of laser diodes connected in series. The number of laser diodes is 14, for example. A wavelength of the laser to be locked is different for each one of the laser diode modules Um.

In the laser diode modules Um1-Umn, respective laser diodes are spatially coupled with terminals on one side of optical fibers Uf1-Ufn. On the terminal face on the opposite side from the side for emitting the laser in each laser diode, a highly reflective mirror is formed. Terminals on the other side of the optical fibers Uf1-Ufn are made to be a fiber array U11.

Tip-end portions of the optical fibers Uf1-Ufn are made to be an optical fiber row, arranged in one row in a direction orthogonal to the emitting direction of the laser. The fiber array U11 is configured by covering the tip-end portions of the optical fiber row for a range of few millimeters to a few tens of millimeters, cylindrically, for example, with resin.

The lasers emitted from the laser diode modules Um1-Umn are emitted from, the fiber array U11, and collimated by a collimator lens U12 to make the approximately parallel light beams. The respective lasers emitted from the collimator lens U12 are incident on a grating (diffraction grating) U13 at different angles from each other to bend their directions, and are emitted via a partially reflective mirror U14.

At this point, the incident angle to the grating 13 is determined, depending on the difference in the position at which the laser is incident on the collimator lens U12.

Part of the laser is reflected by the partially reflective mirror U14 and returned to the respective laser diodes of the laser diode modules Um, and is then reflected by the highly reflective mirror and is incident on the partially reflective mirror U14 again.

In this way, the lasers resonate between the highly reflective mirrors inside the laser diode modules Um and the partially reflective mirror U14. The DDL units 11u constitute the external oscillator. The highly reflective mirrors and the partially reflective mirror U14 constitute the external oscillator mirror.

The DDL unit 11u locks the laser to wavelengths by means of the external oscillator and the grating U13. The grating U13 has a function for coupling spectral beams, in addition to the function of wavelength locking.

With the above configuration and operation, the laser, having a wavelength spectrum SP1 as shown in the figure that is locked to a plurality of wavelengths, will be outputted from the DDL unit 11u.

In the DDL unit 11u, a plurality of banks that are connected in parallel are set. FIG. 4 shows an exemplary configuration of the banks set in the DDL unit 11u. In the present embodiment, it is assumed that two banks are set in the DDL unit 11u. The number of banks may be greater than or equal to 3.

Figure 4:
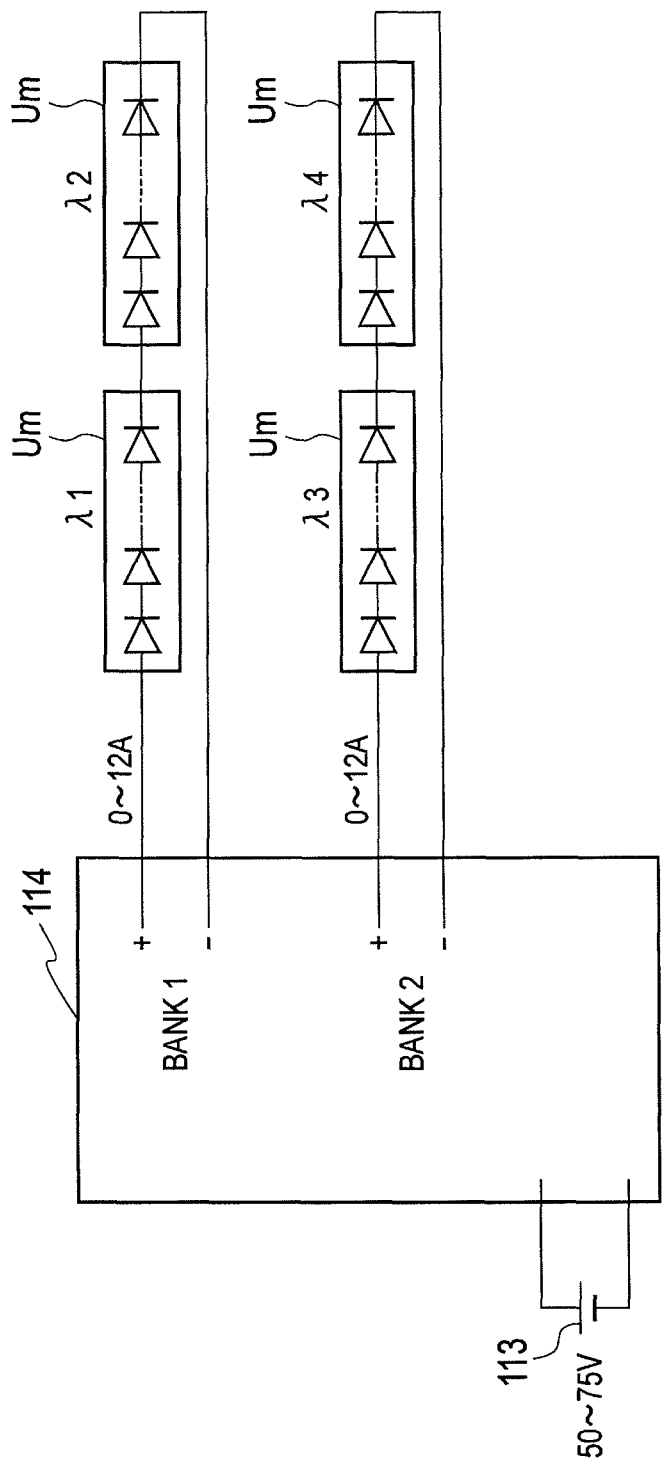
FIG. 4 is a figure for explaining banks that are set in a DDL unit in FIG. 2.

As shown in FIG. 4, to each bank, a plurality of laser diode modules Um are connected in series. In FIG. 4, two laser diode modules Um are connected in series, but it is also possible that three laser diode modules Um may be connected in series.

The number of laser diodes to be connected in series is preferably the number by which the voltage becomes 50-75 V, for example, for which the voltage is easy to control. To each bank, voltage of 50-75 V is supplied by the power supply unit 113, and a current of 0 to 12 A will flow.

In bank 1 or bank 2 shown in FIG. 4, the DDL units 11u output the lasers that are locked to respective wavelengths of the wavelengths $\lambda 1$-$\lambda 4$. Note that the DDL units 11u1-11un in FIG. 2 as a whole will output the lasers of wavelengths from 910 nm to 950 nm, for example.

Figure 5:
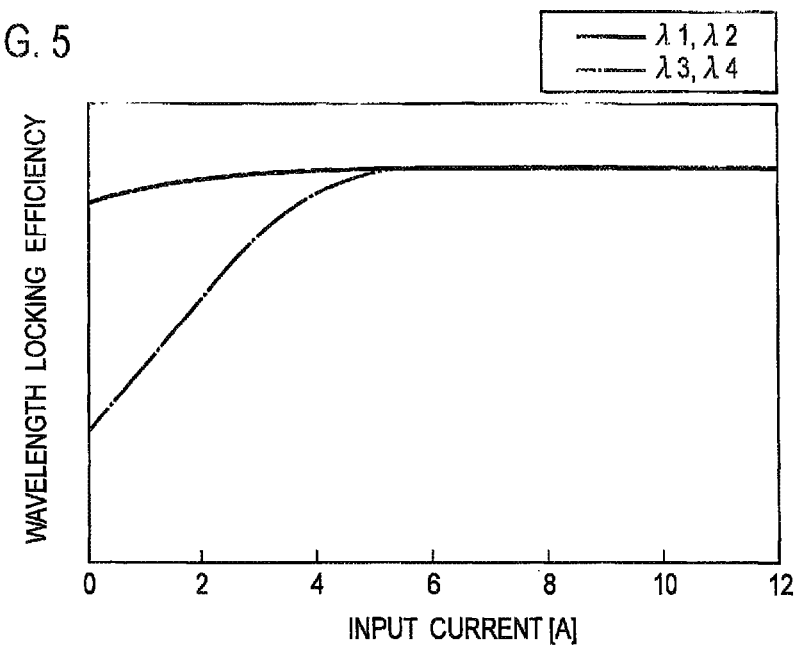
FIG. 5 is a figure for explaining that a characteristic of a wavelength locking efficiency is different depending on a difference in the wavelength of a laser.

Now, using FIG. 5, the fact that a characteristic of the wavelength locking efficiency differs depending on a difference in wavelength of the laser will be described. As shown in FIG. 5, for the wavelengths $\lambda 1$ and $\lambda 2$, the wavelength locking efficiency is high over a nearly entire output region in which the input currents are 0-12 A. On the other hand, for the wavelengths $\lambda 3$ and $\lambda 4$, the wavelength locking efficiency is low in a low output region in which the input currents are about 0-4 A.

Figure 6:
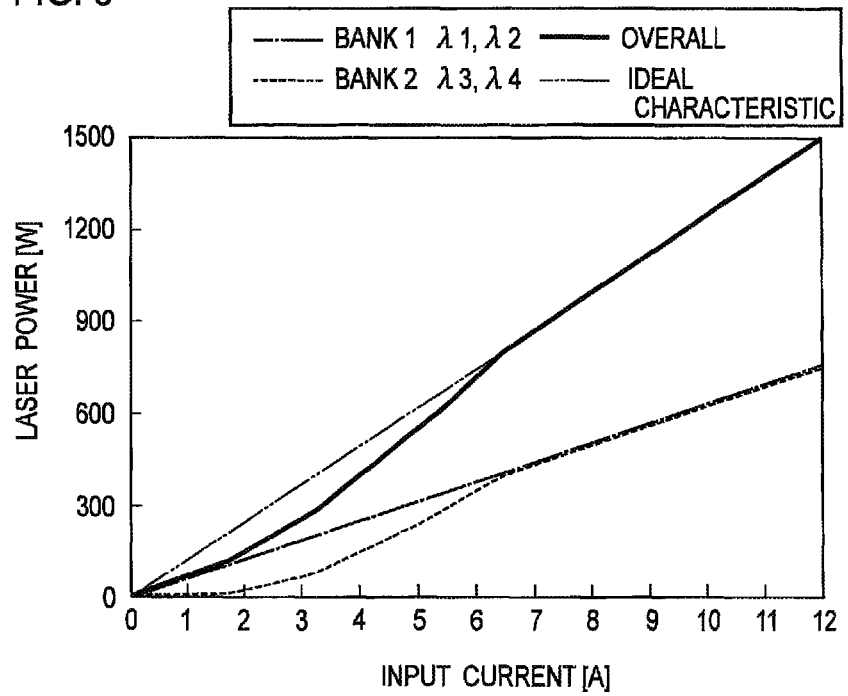
FIG. 6 is a characteristic diagram for a DDL showing a typical relationship of an input current and a laser power.

When the currents of 0-12 A are supplied to the DDL units 11u configured from the laser diode modules Urn having the characteristic of the wavelength locking efficiency as shown in FIG. 5, the laser output with respect to the input current will have a characteristic shown in FIG. 6. In FIG. 6, a one-dot chain line indicates the laser output characteristic with respect to the input current in bank 1 that outputs the lasers locked to the wavelengths of wavelengths $\lambda 1$ and $\lambda 2$, a dashed line indicates the laser output characteristic with respect to the input current in bank 2 that outputs the lasers locked to the wavelengths of wavelengths $\lambda 3$ and $\lambda 4$, and a solid line indicates the output characteristic of the DDL unit 11u (a total of bank 1 and bank 2).

A relationship of the input current and the laser power is ideally linear, as indicated by a two-dot chain line. However, when the characteristic indicated by the one-dot chain line and the characteristic indicated by the dashed line are combined, the characteristic of the DDL unit 11u as a whole will become a downward convex curve, as indicated by the solid line.

Figure 7:
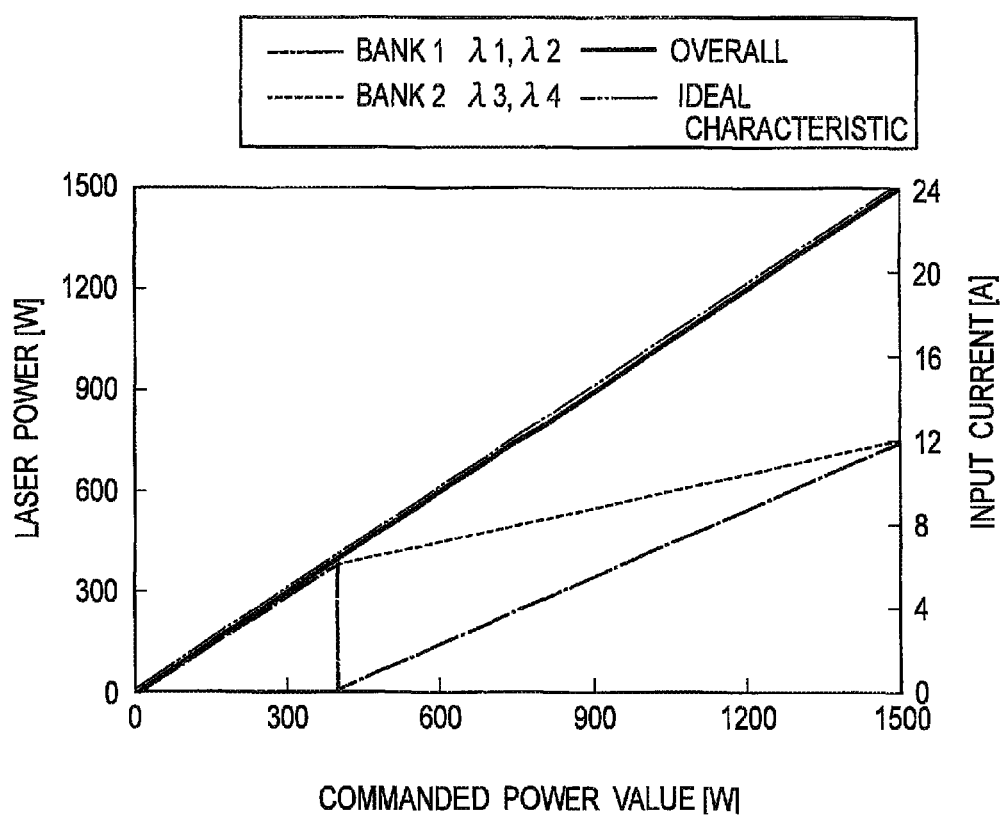
FIG. 7 is a characteristic diagram, showing a relationship of an input current to each bank, a laser output, and a DDL unit output (a bank total laser output) with respect to a commanded output value according to the embodiment.

For this reason, in the present embodiment, bank 1 and bank 2 are controlled as shown in FIG. 7. As noted above, bank 1 is assigned with the wavelengths $\lambda 1$ and $\lambda 2$, for which the wavelength locking efficiency is high from a low output to a high output, and bank 2 is assigned with the wavelengths $\lambda 3$ and $\lambda 4$, for which the wavelength locking efficiency is low at the time of low output.

As shown in FIG. 7, with respect to bank 1, the controller 114 commands powers to output the laser powers from a low output to a high output, as indicated by the one-dot chain line. More specifically, after the input current is increased linearly for the commanded power values from 0 to about 400 W, the input current is set to 0 once. Subsequent to the commanded power value of about 400 W, the input current is increased linearly from 0 to 12 A.

With respect to bank 2, the controller 114 commands powers to set the laser power to be outputted to 0 at a time of low output, and to output the laser power at or above a medium output as indicated by a dashed line. More specifically, the input current is set to 0 for the commanded power values from 0 to about 400 W. The input power is raised to about 6 A at the commanded power value of about 400 W, and subsequently, the input current is increased linearly up to 12 A.

As the controller 114 controls bank 1 and bank 2 as shown in FIG. 7, the DDL unit 11u as a whole can be made to output as indicated by the solid line, so as to be able to make a characteristic close to the ideal characteristic indicated by the two-dot chain line.

As in the above, in order to carry out the input current control for each bank, those for which the wavelength locking efficiency becomes low at a time of low output are assigned to the same bank, and controlled at or above a medium current (a medium output). The controller 114 controls the input currents to the laser diodes of each of the plurality of banks, individually in correspondence to the characteristic of the wavelength locking efficiency.

It suffices for the controller 114 to control the input currents to the laser diodes of each of the plurality of banks individually, so as to make a laser power obtained by combining the lasers outputted by respective ones of the plurality of banks to be a required oscillator output, and also so as to maintain a high wavelength locking efficiency throughout the entire output region of the oscillator.

To be concrete, when the plurality of banks include at least a first bank for which the wavelength locking efficiency at a time of low current where the input current is from 0 to a predetermined value is in a first state, and a second bank for which the wavelength locking efficiency is in a second state that is lower than the first state, it suffices for the controller 114 to control as follows.

The controller 114 controls the output of the second bank to be 0 while the output required for the DDL unit 11u as a whole is from 0 to a predetermined value.

In accordance with the semiconductor laser oscillator according to the present embodiment, it is possible to improve the wavelength locking efficiency at a time of low output for the oscillator output, and in conjunction with that, it will be used at a region for which the photo-electric conversion efficiency is high, so that it is possible to reduce wasteful power at a time of low output.

In addition, in accordance with the semiconductor laser oscillator according to the present embodiment, it is possible to prevent heat generation inside the oscillator that is affected by an output loss due to the lowering of the wavelength locking efficiency and a local neat generation of the transmission fiber, so that it is possible to stabilize the oscillator output while preventing damages to optical components.

The present invention is not limited to the embodiment described above, and is changeable in various ways within the scope without departing from the scope of the present invention.

The laser diodes are single emitter laser diodes, as one example. The laser diodes may be laser diode modules in which a plurality of single emitter laser diodes are spatially coupled.

The laser diodes may be diode laser bars. The laser diodes may be laser diode modules in which a plurality of diode laser bars are spatially coupled. Note that the diode laser bar is a chip on which emitters are arranged laterally at 500 µm intervals, for example.

INDUSTRIAL APPLICABILITY

The present invention can be utilized in the semiconductor laser oscillator for emitting a laser.

The invention claimed is:

1. A semiconductor laser oscillator comprising:
a diode source comprising a plurality of banks, in which one bank comprises a plurality of laser diodes connected in series, wherein
the diode source comprises a wavelength lock configured to lock to a plurality of wavelengths, and
the semiconductor laser oscillator further comprises a controller configured to control input currents to the plurality of laser diodes of each of the plurality of banks individually in correspondence to a characteristic of a wavelength locking efficiency, and to control an output of the diode source as a whole to a required output,
wherein the plurality of banks comprise at least a first bank for which the wavelength locking efficiency at a time of low current where an input current is from 0 to a predetermined value is in a first state, and a second bank for which the wavelength locking efficiency at the time of low current is in a second state that is lower than the first state, and
the controller controls an output of the second bank to be 0 while an output required for the diode source as a whole is from 0 to a predetermined value.

2. The semiconductor laser oscillator according to claim 1, wherein the laser diodes are single emitter laser diodes.

3. The semiconductor laser oscillator according to claim 1, wherein the laser diodes are laser diode modules in which a plurality of single emitter laser diodes are spatially coupled.

4. The semiconductor laser oscillator according to claim 1, wherein the laser diodes are diode laser bars.

5. The semiconductor laser oscillator according to claim 1, wherein the laser diodes are laser diode modules in which a plurality of diode laser bars are spatially coupled.

* * * * *